United States Patent
Lee et al.

(10) Patent No.: US 7,867,317 B2
(45) Date of Patent: Jan. 11, 2011

(54) PRE-TREATMENT PROCESS FOR LIBERATION OF METALS FROM WASTE PRINTED CIRCUIT BOARDS USING ORGANIC SOLUTION

(75) Inventors: Jae Chun Lee, Daejeon (KR); Jae Min Yoo, Daejeon (KR); Jin Ki Jeong, Daejeon (KR); Manis Kumar Jha, Daejeon (KR)

(73) Assignee: Korea Institute of Geoscience and Minderal Resources, Daejeon (KR)

( * ) Notice: Subject to any disclaimer, the term of this patent is extended or adjusted under 35 U.S.C. 154(b) by 62 days.

(21) Appl. No.: 12/310,324

(22) PCT Filed: Jul. 28, 2008

(86) PCT No.: PCT/KR2008/004391
§ 371 (c)(1),
(2), (4) Date: Feb. 20, 2009

(87) PCT Pub. No.: WO2009/064063
PCT Pub. Date: May 22, 2009

(65) Prior Publication Data
US 2010/0071507 A1    Mar. 25, 2010

(30) Foreign Application Priority Data
Nov. 16, 2007    (KR) .................. 10-2007-0116992

(51) Int. Cl.
*C22B 3/22*    (2006.01)
*B01D 43/00*    (2006.01)

(52) U.S. Cl. .................. 75/704; 75/711; 29/403.1; 241/24.14

(58) Field of Classification Search .................. 75/711, 75/704; 241/24.14; 29/403.1
See application file for complete search history.

(56) References Cited

U.S. PATENT DOCUMENTS

| | | | |
|---|---|---|---|
| 5,232,489 A * | 8/1993 | Mertens-Gottselig et al. | . 75/715 |
| 5,979,033 A | 11/1999 | Chang et al. | |
| 6,523,764 B2 * | 2/2003 | Ueno et al. .............. | 241/24.13 |
| 7,107,661 B2 * | 9/2006 | Kamimura et al. ......... | 29/403.4 |

FOREIGN PATENT DOCUMENTS

| | | |
|---|---|---|
| JP | 2005-324176 | 11/2005 |
| JP | 2007-92138 A | 4/2007 |

(Continued)

OTHER PUBLICATIONS

Machine translation of JP 07086724 published Mar. 31, 1995.*
Machine translation of JP 2007092138 published Apr. 12, 2007.*
KR 10-20010042706 (application number), published Dec. 3, 2004, abstract.*
Machine translation of JP 2007-092138 published Sep. 29, 2005.*

*Primary Examiner* — George Wyszomierski
*Assistant Examiner* — Tima M McGuthry-Banks
(74) *Attorney, Agent, or Firm* — Clark & Brody

(57) ABSTRACT

A method for recovering valuable metals contained in printed circuit boards of waste electronic machine, and more particularly, a method for liberating metal and plastic laminated in waste printed circuit boards uses an organic solvent and then separates and recovers the liberated metal components using an electrostatic separation process.

4 Claims, 1 Drawing Sheet

FOREIGN PATENT DOCUMENTS

| | | |
|---|---|---|
| KP | 2001-0067641 | 7/2001 |
| KR | 1998-068762 | 10/1998 |
| KR | 1999-0070807 | 9/1999 |
| KR | 2003-0006792 | 1/2003 |
| KR | 1786222 A | 6/2006 |
| KR | 10-2007-0077114 | 7/2007 |

* cited by examiner

PRE-TREATMENT PROCESS FOR LIBERATION OF METALS FROM WASTE PRINTED CIRCUIT BOARDS USING ORGANIC SOLUTION

TECHNICAL FIELD

The present invention relates to a method for recovering valuable metals contained in printed circuit boards of waste electronic machine, and more particularly, to a method for recovering valuable metals from waste printed circuit boards by separating several plastic layers laminated using an organic solution and then separating plastic components from metal components using an electrostatic separation process.

BACKGROUND ART

Generally, the waste printed circuit boards contain noble metals such as gold and silver, and valuable metals such as iron, copper, and nickel.

As changes in performance and profile of the electronic machine rapidly proceed according to needs of consumers, usage duration of the electronic machines is becoming shortened. Subsequently, the amount of the waste printed circuit boards generated is being increased. The producers have the increased burden of processing the waste electronic machine, and also environmental contamination due to the waste electronic machine causes a social problem. Since the waste printed circuit board contains a large amount of valuable metals, the valuable metals can be recovered via proper processes to allow it to be reused, which is very useful in term of resource utilization and prevention of environmental contamination.

In order to recover the valuable metal from the waste printed circuit boards, it is necessary to remove the non-metal component which occupies about 40~60% of the waste printed circuit boards. The process of separating the metal components and the plastic components from the waste printed circuit boards is broadly divided into a physical separation process and a wet process.

As a conventional technology, Korean Patent laid-open No. 2003-0006792 relates to a method for recovering the valuable metal from the waste printed circuit boards, in which there is disclosed a technology of passing the waste printed circuit boards through crushing, air separation, electrostatic separation and magnetic separation process, and then melting and separating copper, iron, zinc, nickel and aluminum components using sulfuric acid and oxygenated water, melting and separating gold and silver using $(NH_4)_2S_2O_3$, $CuSO_4$, and $NH_4OH$ solution, melting and separating lead using salt water, and melting and separating palladium using sulfuric water.

Further, Korean Patent laid-open No. 1999-0070807 relates to a method of extracting the noble metals from the waste printed circuit boards using converter and electric furnace slag, in which there is disclosed a technology for extracting the noble element such as gold, silver, platinum family element from the waste printed circuit boards.

Korean Patent Laid-Open No. 1998-068762 relates to a method of recovering the valuable metals from the waste printed circuit boards, in which there is disclosed a technology of recovering the valuable metals from the waste printed circuit boards by the physical separation process using an inclined vibration plate after being crashed by a hammer mill.

Korean Patent Laid-Open No. 2001-0067641 relates to a method of recovering the valuable metal element from the waste printed circuit boards using Chelate resin, and discloses a technology for recovering the noble metal element by crashing the waste printed circuit boards, melting the metal component to cause it to be absorbed into the Chelate resin, and desorpting the valuable metal absorbed into the Chelate resin using an eluant.

Korean Patent Laid-Open No. 2007-0077114 discloses a technology for recovering tin using heat melting and tin removal solution, melting and separating copper using strong acid solution, separating brominates epoxy resin from glass fiber by heat chemical reaction using Sodium Nitrate, and recovering carbonized glass fiber and copper lamina using water cleaning.

Japanese Patent Laid-Open No. 2005-324176 relates to a method for recycling the waste printed circuit boards, in which there is disclosed a technology for recovering metal materials and insulated materials using a forced filtering method applying pressure after making viscosity of thermoplastic resin lower by heating the waste printed circuit boards produced by the thermoplastic resin.

U.S. Pat. No. 5,979,033 relates to a method for recycling the waste printed circuit boards, and discloses a technology for recovering sheet copper, thermosetting resin and glass fiber by crashing the waste printed circuit boards, putting it into melted tin, and then stirring and carbonizing it.

In a case of using the wet process such as the Korean Patent Laid-Open No. 2003-0006792, the Korean Patent Laid-Open No. 2001-0067641, the U.S. Pat. No. 5,979,033, since the metal components are recovered by leaching it from the waste printed circuit boards using acid, there are disadvantages that the criterion for determining the leaching rate must be dependent upon experience and waste water is excessively generated, which result in difficulty in commercialization.

Meanwhile, in a case of using the physical separation process such as the Korean Patent Laid-Open No. 1998-068762 and the Japanese Patent Laid-Open No. 2005-324176, though it is preferable that the procedure is simple and the waste water is not generated, the separation efficiency upon separating the metal component and the non-metal component from the waste printed circuit boards using the physical separation method is disadvantageously lowered. As well, the metal components present between the plastic components can not be substantially recovered, and therefore loss ratio of the metal components is disadvantageously increased.

DISCLOSURE

Technical Problem

An object of the present invention is to provide a simple and economical method for recovering metal components existing between plastic components while enhancing separation efficiency of the metal components and the non-metal components from waste printed circuit boards.

Technical Solution

The method for liberating the metal from the waste printed circuit boards includes (a) causing a liberation of the metal and plastic from the cut waste printed circuit boards by stirring the waste printed circuit boards after putting them into an organic solvent; (b) cleaning and drying the metal and the plastic after separating the metal and the plastic by filtering them out; and (c) recovering the metal from a mixture of the metal and the plastic dried using an electrostatic separation process.

The present invention can minimize the pre-process by causing the liberation of the plastic and the metal using the organic solvent after crashing (cutting) the waste printed circuit boards and separate the metal from the plastic efficiently, in order to recover the metal from the waste printed circuit boards. Further, it is possible to provide smart process which is capable of minimizing equipment space and eliminating unnecessary process.

Preferably, the organic solvent in the step (a) is N,N-Dimethylformamide ($HCON(CH_3)_2$), Methyl ethyl ketone ($CH_3COC_2H_5$), Tetra hydro furan ($C_4H_8O$), Stripoxy, or combination thereof, and more preferably N,N-Dimethylformamide ($HCON(CH_3)_2$).

Preferably, the cut waste printed circuit boards of 70 to 120 g is put into the organic solvent of 1 L, in order to cause the liberation of the metal component and the non-metal component from the waste printed circuit board.

Preferably, the stirring of the step (a) is performed at a temperature range of 110 to 140° C., more preferably the stirring of the step (a) is performed at a revolution velocity of 800 to 1200 rpm at a temperature range of 110 to 140° C., and further the stirring is performed for 30 minutes to 2 hours.

Advantageous Effects

The recovering method according to the present invention can separate the non-metal components containing the plastic and the metal components from the waste printed circuit boards crash by separating the several plastic layers laminated via simple pre-process using an organic solvent (N,N-Dimethylformamide; $HCON(CH_3)_2$) and obtain the metal recovery ratio of 99.99% via the pre-process and an electrostatic separation process.

DESCRIPTION OF DRAWINGS

The above and other objects, features and advantages of the present invention will become apparent from the following description of preferred embodiments given in conjunction with the accompanying drawings, in which.

BEST MODE

Figure 1:
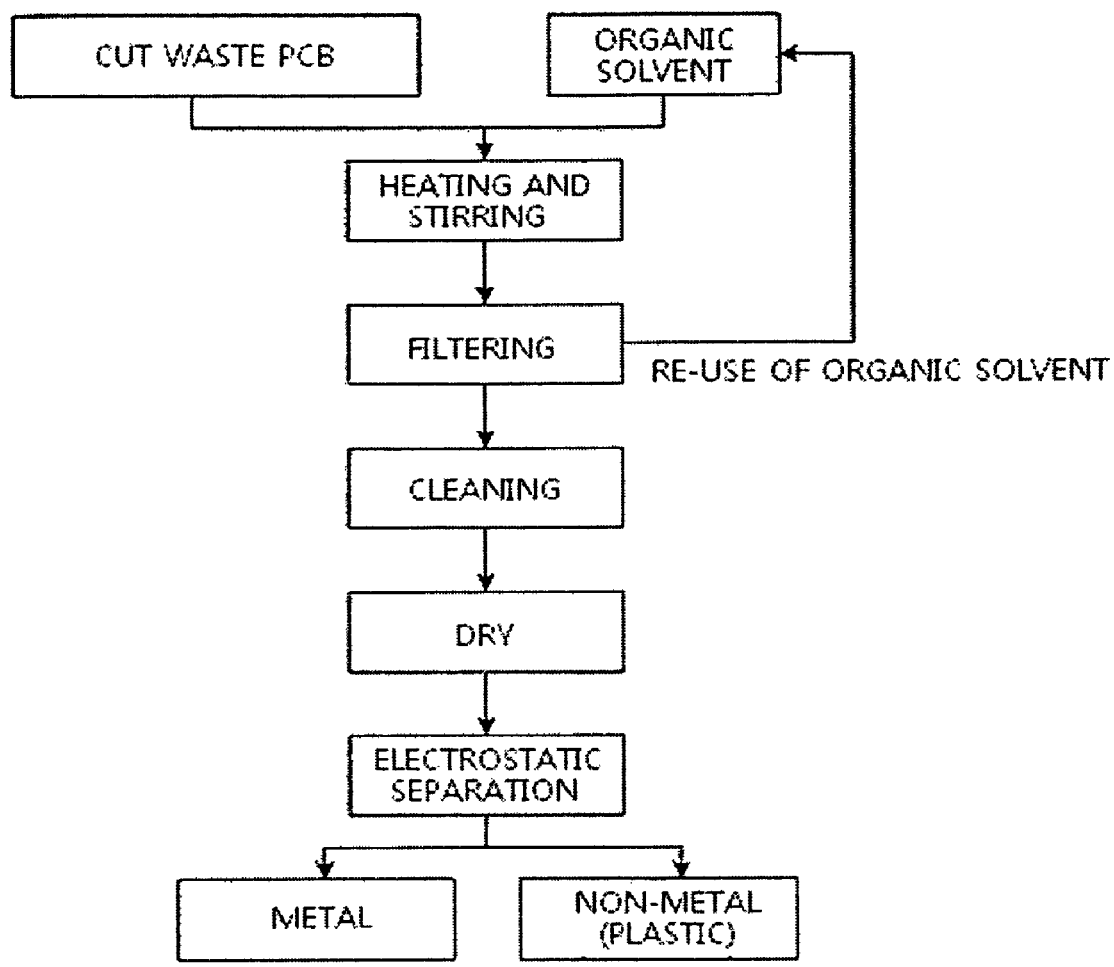
FIG. 1 is a flow diagram showing an embodiment according to the present invention for recovering the metal from the waste printed circuit board.

Hereinafter, an embodiment of the present invention will be described in detail with reference to an accompanying drawing. The man skilled in the art will appreciated that the drawing is provided as an example in order to notify a scope of the present invention sufficiently. Therefore, the present invention is not limited to the drawing indicated below, but can be embodied in other forms.

At this time, provided that technological terms and science terms used herein do not contain another definition, it is noted that the man skilled in the art typically understands them. The description on the known function and structure which unnecessarily make unclear the subject matter of the present invention will be omitted.

FIG. 1 is a flow diagram showing an embodiment for recovering the metal from the waste printed circuit board according to the present invention. As shown in FIG. 1, after the waste printed circuit board is cut in a size of 1 mm to 20 mm using a cutting tool, it is put into an organic solvent and then stirred, which leads to a liberation of metal components and non-metal components from the waste printed circuit board. The metal components can be a metal plate attached onto the plastic plate by the organic adhesive, and further can be a metal layer, thin metal layer or metal body which is present on the plastic plate using heat and mechanical pressure such as in electrochemical plating, vaporization, soldering or rolling process. The non-metal components are a plastic plate or a glass fiber plate.

The organic adhesive is melted into the organic solvent to cause the liberation of the metal and non-metal components if the plastic plate and the metal components are connected by the organic adhesive, whereas the organic solvent is passed into an interface between the plastic plate and the metal components and the organic matter forming the interface (interfacial region of plastic plate) is melted into the organic solvent to cause the liberation of them if the plastic plate and the metal components are connected without the organic adhesive.

The organic solvent is used with N,N-Dimethylformamide ($HCON(CH_3)_2$), Methyl ethyl ketone ($CH_3COC_2H5$), Tetra hydro furan ($C_4H_8O$), Stripoxy, or combination thereof, and is preferably used with N,N-Dimethylformamide.

The waste printed circuit board is preferably cut in a size of 1 mm to 20 mm in order to efficiently cause the liberation using the above-mentioned organic solvent. If the cut size is less than 1 mm, there are disadvantages that it is difficult to cut it using the common cutting tool and it takes a long time to perform cutting process. If the cut size is greater than 20 mm, there is a disadvantage that the liberation can not be easily caused using the organic solvent.

The cut waste printed circuit board of 70 to 120 g is preferably put into the organic solvent of 1 L in order to efficiently cause the liberation using the above-mentioned organic solvent. In a case of putting the waste printed circuit boards of less than 70 g, it can not be expected to increase the separation efficiency at the same stirring time, whereas in a case of putting the waste printed circuit boards of greater than 120 g, the stirring is not performed efficiently so that the separation efficiency is lowered.

The stirring is preferably performed at a revolution rate of 800 to 1200 rpm at a temperature range of 110 to 140° C., in order to efficiently cause the liberation by means of the organic solvent. It is possible to enhance the activity of the organic solvent and minimize the loss of the organic solvent caused due to volatilization by performing the stirring at the above range of temperature. Further, the stirring is performed at a revolution rate of 800 to 1200 rpm, wherein the revolution may be performed by using a magnetic bar or putting the organic solvent and the waste printed circuit boards into the proper vehicle and then rotating the vehicle by means of the typical ball milling device. The revolution at 800 to 1200 rpm is a stirring condition to enhance the separation efficiency by applying the physical attack to the waste printed circuit board cut and equalize melting capability of the organic solvent The stirring at the above condition is preferably performed for 30 minutes to 2 hours. The liberation is not caused if the stirring is performed for less than 30 minutes, whereas the separation efficiency is lowered if the stirring is performed for greater than 2 hours.

After the stirring is performed, it is preferable to recover the metal components and plastic components, along with collecting the organic solvent via filtering process with mesh. The collected organic solvent is preferably re-used, as shown in FIG. 1.

The metal and plastic components recovered from the mesh are subject to a cleaning step and a drying step, and then the metal components are separated from the non-metal components using the electrostatic separation process. The electrostatic separation may be of an electrostatic induction type, a corona discharge type, or a friction charge type.

Embodiment 1

The waste printed circuit boards are cut respectively in a size of 7 mm, 5 mm, and 3 mm and the each cut waste printed circuit boards of 100 g is put into a beaker of N,N-Dimethylformamide of 1 L. The temperature is remained at 130° C. and the stirring is performed for 1 hour at a revolution velocity of 900 rpm using the magnetic bar having a length of 5 cm. After the stirring is finished, the non-metal components and the metal components are separated from the organic solution via the filtering process with mesh and then dried at a temperature of 80° C. Subsequently, the dried components pass through the electrostatic separation process, thereby obtaining the metal recovery rate of 99.99%.

Table 1 below summarizes the metal recovery rate for each size of the cut waste printed circuit boards.

TABLE 1

| | | Electrostatic separation test | |
|---|---|---|---|
| section | Cut size | Collect rate of organic solvent | Recovery rate of metal |
| 1 | 7 mm | 99.99% | 99.99% |
| 2 | 5 mm | 99.99% | 99.99% |
| 3 | 3 mm | 99.99% | 99.99% |

Though specific details such as the cut size and the organic solvent are described according to the present invention, it is not intended to limit a scope of the present invention, but provided for the purpose of overall understanding of the present invention. Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A method for recovering metal from waste printed circuit boards, comprising steps of:
   (a) cutting waste printed circuit boards and causing a liberation of the metal and plastic from the cut waste printed circuit boards by stirring the waste printed circuit boards after putting them into an organic solvent;
   (b) separating the metal and the plastic liberated from the organic solution by filtering through a sieve and cleaning and drying a mixture of the metal and the plastic separated; and
   (c) recovering the metal from a mixture of the metal and the plastic dried using an electrostatic separation process.

2. The process according to claim 1, wherein the organic solvent in the step (a) is N,N-dimethylformamide (HCON(CH$_3$)$_2$), methyl ethyl ketone (CH$_3$COC$_2$H$_5$), tetrahydrofuran (C$_4$H$_8$O), stripoxy, or combination thereof.

3. The method according to claim 2, wherein the cut waste printed circuit boards of 70 to 120 g is put into the organic solvent of 1 L.

4. The method according to claim 1, wherein the stirring of the step (a) is performed at a temperature range of 110 to 140° C.

* * * * *